(12) United States Patent
Huang et al.

(10) Patent No.: US 8,865,998 B2
(45) Date of Patent: Oct. 21, 2014

(54) PHOTOVOLTAIC ELECTROCHROMIC DEVICE

(75) Inventors: Lee-May Huang, Hsinchu (TW);
Fang-Yao Yeh, Taoyuan County (TW);
Kuo-Chuan Ho, Taipei County (TW);
Chih-Wei Hu, Kaohsiung (TW);
Chih-Yu Hsu, Taoyuan County (TW);
Chun-Ming Yeh, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 1105 days.

(21) Appl. No.: 12/781,818

(22) Filed: May 18, 2010

(65) Prior Publication Data

US 2010/0294335 A1    Nov. 25, 2010

Related U.S. Application Data

(63) Continuation-in-part of application No. 12/689,229, filed on Jan. 19, 2010, now abandoned.

(30) Foreign Application Priority Data

May 25, 2009    (TW) .................. 98117341 A

(51) Int. Cl.
*H01L 31/0216*    (2014.01)
*H01L 31/18*    (2006.01)
(Continued)

(52) U.S. Cl.
CPC ........... *H01L 31/0392* (2013.01); *Y02E 10/543* (2013.01); *G02F 1/163* (2013.01);
(Continued)

(58) Field of Classification Search
USPC ........................................ 136/244, 256, 252
See application file for complete search history.

(56) References Cited

U.S. PATENT DOCUMENTS

| 5,377,037 A | 12/1994 | Branz et al. |
| 5,384,653 A | 1/1995 | Benson et al. |

(Continued)

FOREIGN PATENT DOCUMENTS

| JP | 62-119529 | 5/1987 |
| JP | H1-169224 | 11/1989 |

(Continued)

OTHER PUBLICATIONS

Authored by Gao et al., article titled "Approaches for large-area a-SiC:H photovoltaic-powered electrochromic window coatings," adopted from Journal of Non-Crystalline Solids 266-269, 2000, pp. 1140-1144.

(Continued)

*Primary Examiner* — Golam Mowla
(74) *Attorney, Agent, or Firm* — Jianq Chyun IP Office

(57) ABSTRACT

A photovoltaic electrochromic device and a method of manufacturing the same are provided. According to the method, at least one thin-film solar cell is formed on a transparent substrate, wherein the thin-film solar cell at least includes an anode, a photoelectric conversion layer, and a cathode, and a portion of a surface of the anode is exposed from the thin film solar cell. An electrochromic thin film is then deposited on at least one surface of the cathode and the exposed surface of the anode. Thereafter, an electrolyte layer is formed on a surface of the thin-film solar cell to cover the electrochromic thin film. The anode and the cathode of the thin-film solar cell also serve as the anode and the cathode of the photovoltaic electrochromic device.

38 Claims, 22 Drawing Sheets

(51) Int. Cl.
- *H01L 31/0725* (2012.01)
- *H01L 31/0392* (2006.01)
- *H01L 31/20* (2006.01)
- *G02F 1/157* (2006.01)
- *H01L 31/0687* (2012.01)
- *H01L 31/0376* (2006.01)
- *G02F 1/163* (2006.01)
- *G02F 1/133* (2006.01)

(52) U.S. Cl.
CPC .......... *H01L 31/1828* (2013.01); *H01L 31/184* (2013.01); *H01L 31/0725* (2013.01); *G02F 2001/13324* (2013.01); *Y02E 10/547* (2013.01); *H01L 31/1804* (2013.01); *Y02E 10/544* (2013.01); *Y02E 10/548* (2013.01); *H01L 31/202* (2013.01); *G02F 1/157* (2013.01); *H01L 31/0687* (2013.01); *Y02E 10/52* (2013.01); *H01L 31/03762* (2013.01)
USPC ............................ 136/244; 136/256; 136/252

(56) References Cited

U.S. PATENT DOCUMENTS

| | | | |
|---|---|---|---|
| 6,045,643 | A | 4/2000 | Byker et al. |
| 6,369,934 | B1 | 4/2002 | Bechinger et al. |
| 7,855,822 | B2 | 12/2010 | Huang et al. |
| 2006/0269664 | A1 | 11/2006 | Gleason et al. |
| 2007/0102673 | A1 | 5/2007 | Durrant et al. |
| 2010/0000590 | A1 | 1/2010 | Huang |

FOREIGN PATENT DOCUMENTS

| | | |
|---|---|---|
| JP | H2-71823 | 5/1990 |
| JP | U1990071823 | 5/1990 |
| JP | 2006-179681 | 7/2006 |
| JP | 2006-287164 | 10/2006 |
| JP | 2007-102197 | 4/2007 |
| JP | 2009-042697 | 2/2009 |

OTHER PUBLICATIONS

Authored by Kraft et al., article titled "Large-area electrochomic glazing with ion-conducting PVB interlayer and two complementary electrodeposited electrochromic layers," adopted from Solar Energy Materials & Solar Cells 90, 2006, pp. 469-476.

Authored by Kraft et al., article titled "Properties, performance and current status of the laminated electrochromic glass of gesimat," adopted from Solar Energy Materials & Solar Cells 93, 2009, pp. 2088-2092.

Authored by Deb et al., article titled "Stand-alone photovoltaic-powered electrochromic smart window," adopted from Electrochimica Acta 46, 2001, pp. 2125-2130.

"Office Action of Japan Counterpart Application", issued on Dec. 11, 2012, p. 1-p. 3.

"Notice of Allowance of Taiwan Counterpart Application", issued on Dec. 4, 2012, p. 1-p. 4.

Rottmann et al., "Illuminance measurements and thermal analysis of test rooms equipped with high performance electrochromic glazing", Glass Performance Days 2007, pp. 340-343.

"Office Action of Germany Counterpart Application with English Translation", issued on Dec. 20, 2011, p. 1-p. 16.

"Office Action of Japan Counterpart Application", issued on Dec. 3, 2013, p. 1-p. 4.

PHOTOVOLTAIC ELECTROCHROMIC DEVICE

CROSS-REFERENCE TO RELATED APPLICATION

This is a continuation-in-part application of patent application Ser. No. 12/689,229 filed on Jan. 19, 2010, which claims the priority benefit of Taiwan patent application serial no. 98117341, filed May 25, 2009 and is now pending. The entirety of each of the above-mentioned patent applications is hereby incorporated by reference herein and made a part of this specification.

BACKGROUND OF THE INVENTION

1. Field of the Invention

The present invention relates to a photovoltaic electrochromic device and a method of manufacturing the same.

2. Description of Related Art

In view of structure, typical electrochromic devices are divided into a solid type and a liquid type. The structure of a solid-type electrochromic device 100 includes two glass or plastic transparent substrates 102. At least five coating/plating layers (such as a transparent conductive layer 104, an electrochromic thin film 106, a solid electrolyte 108, and an ion storage layer 110) which respectively has different function, are disposed between the two substrates 102, like a sandwich, to constitute a battery-like structure, as shown in FIG. 1. The structure of a liquid-type electrochromic device 200 is formed by two transparent conductive substrates 202. One or two sides of the anodes and the cathodes on two opposite transparent conductive substrates 202 are respectively coated/plated with a transparent conductive electrochromic layer 204, and an electrolyte solution 206 is added between the transparent conductive substrates 202, as shown in FIG. 2.

Compared to electrochromic device which has been developed for some time, the integration of photovoltaic and electrochromic technologies provides better efficiency in energy saving, for photovoltaic electrochromic device can achieve color change in electrochromic layers without additional power source. At the beginning, photovoltaic electrochromic technology is developed based on the concept of using compound films of a Prussian blue electrochromic thin film and a photosensitive layer-$TiO_2$ for performing color change. In recent years, such a concept has been further extended to separate the photosensitive layer and the electrochromic layer to the anode and the cathode respectively for constituting a device. This kind of device can be described as having electrochromic materials inserted into dye sensitive solar cells, which has become the most widely-discussed subject in the research of photoelectrochromic technology. The electrochromic material is $WO_3$ and the dye sensitive solar cell mainly utilizes Ruthenium Ru-dye. The structure of a photoelectrochromic device 300 is shown in FIG. 3. The photoelectrochromic device 300 is a multi-layer photoelectrochemical device that includes two transparent conductive substrates 302, a working electrode layer 304 formed of photosensitive material and disposed between the transparent conductive substrates 302, an electrolyte layer 306, and an auxiliary electrode layer 308 formed of electrochromic material.

U.S. Pat. No. 6,369,934B1 has disclosed a whole organic multi-layer photoelectrochemical device, for instance. However, to apply such a structure to practical applications, many problems need to be overcome such as the long term stability of the photosensitive layer and the possibility of developing devices having larger sizes.

U.S. Pat. No. 5,384,653 provides a variable transmittance of two glass panels separated from each other, wherein an electrochromic layer stack is disposed at the inner side of the first glass panel in conjunction with an array of photovoltaic cells deposited along an edge of the glass panel, to produce electric power necessary to change the color of the electrochromic layer stack. A battery is placed in parallel fashion to the array of photovoltaic cells to allow the user the ability to manually override the system to a desired transmittance.

U.S. Pat. No. 6,055,089 provides an electrochromic system that combines a solar cell with an electrochromic device, wherein an inorganic electrochromic glass is disposed in front of a silicon crystal solar cell module, and a layer of air is between the inorganic electrochromic glass and the silicon crystal solar module. Under sunlight irradiation, electricity generated by the solar cell is outputted to the electrochromic device via terminals of the cell so as to change the color of an electrochromic layer. The color contrast within the electrochromic system controls the incident light intensity falling on solar cell and thereby determines the output current of the solar cell.

U.S. Pat. No. 5,805,330 provides an all-organic structure, wherein both an upper layer and a lower layer are transparent conductive substrates, and an organic small molecule electrochromic material and an electrolyte solution are disposed therebetween. A solar cell module adheres to the edge of the electrochromic glass, so that when illuminated by sunlight, the current generated by the solar cell is supplied to the electrochromic device via an output terminal of the cell and the electrochromic device thereby changes color.

Moreover, U.S. Pat. No. 5,377,037 has disclosed a design of combining a solar cell with an electrochromic device to form one single device, which is basically manufactured by using a stacking method to combine monolithic silicon thin-film solar cells with an inorganic electrochromic device on a first conductive glass substrate, and then oppositely bonding the silicon thin-film solar cells with another transparent conductive glass substrate. Between the substrates, a liquid organic electrolyte solution or a solid inorganic electrolyte layer is disposed. The color contrast of the device is comparatively low.

SUMMARY OF THE INVENTION

The present invention provides a photovoltaic electrochromic device which changes the color of electrochromic thin films when being illuminated. The photovoltaic electrochromic device performs color change without additional power source and can be used as a general thin-film solar cell for generating electricity. The present invention further provides a method of manufacturing a photovoltaic electrochromic device in which the anodes and the cathodes of thin-film solar cell also serve as the anodes and the cathodes of photovoltaic electrochromic device.

The present invention provides a photovoltaic electrochromic device, which at least includes a transparent substrate, at least one thin-film solar cell, at least one electrochromic thin film, and an electrolyte layer. The at least one thin-film solar cell is disposed on the transparent substrate, wherein the thin-film solar cell at least includes an anode, a photoelectric conversion layer, and a cathode, and a portion of a surface of the anode is exposed from the thin film solar cell. The at least one electrochromic thin film is disposed on at least one surface of the cathode and the exposed surface of the anode of the thin-film solar cell. The electrolyte layer covers the electrochromic thin film. Moreover, the anode and the cathode of the thin-film solar cell also serve as the anode and the cathode of the photovoltaic electrochromic device.

The present invention further provides a method of manufacturing a photovoltaic electrochromic device, and the method comprises forming at least one thin-film solar cell on a transparent substrate, wherein the thin-film solar cell at least includes an anode, a photoelectric conversion layer, and a cathode, and a portion of a surface of the anode is exposed from the thin film solar cell. Further, an electrochromic thin film is deposited on at least one surface of the cathode and the exposed surface of the anode. Thereafter, an electrolyte layer is formed on a surface of the thin-film solar cell to cover the electrochromic thin film, wherein the anode and the cathode of the thin-film solar cell also serve as an anode and a cathode of the photovoltaic electrochromic device.

Based on the above, the present invention utilizes the current generated by the thin-film solar cells for performing light induced electroplating. Through redox reaction, monomers, chromophores or metal ions in an electroplating solution are directly deposited on the electrodes (anodes or cathodes) of the thin-film solar cells. Moreover, the photovoltaic electrochromic device of the present invention is a single-side-substrate photovoltaic electrochromic device, for the anodes and the cathodes are all formed on the same surface of the transparent substrate.

To make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
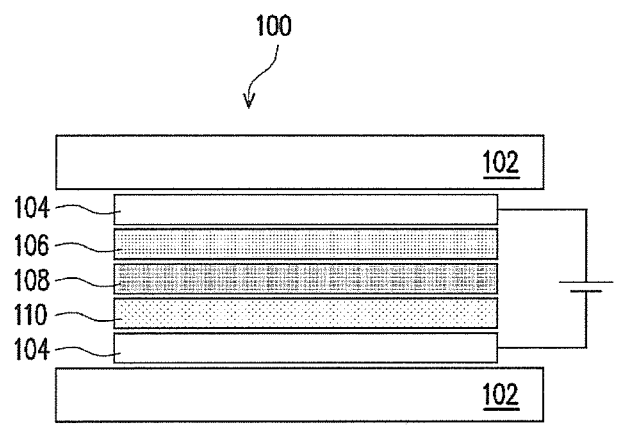
FIG. 1 is a schematic view depicting a structure of a conventional solid-type electrochromic device.
Figure 2:
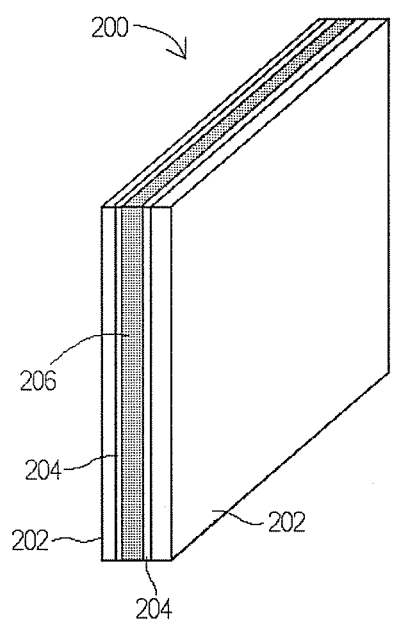
FIG. 2 is a schematic view depicting a structure of a conventional liquid-type electrochromic device.
Figure 3:
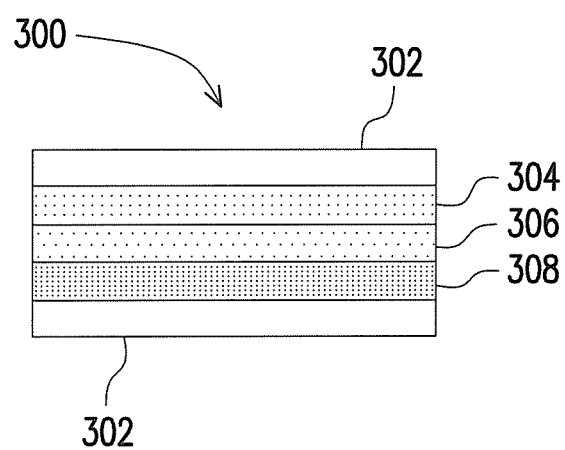
FIG. 3 is a schematic view depicting a structure of a conventional photoelectrochromic device.
Figure 4A:
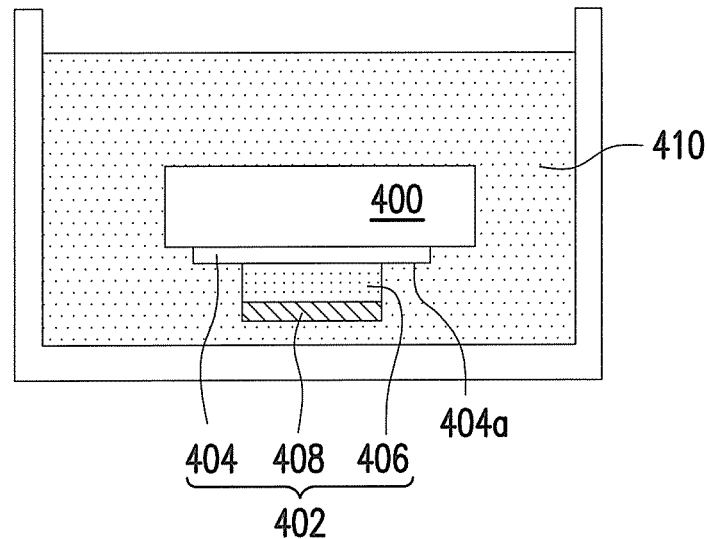
FIGS. 4A-4B, 5A, 5B and 6 are schematic cross-sectional views illustrating the procedures for manufacturing electrochromic thin films of a photovoltaic electrochromic device according to the first embodiment of the present invention.
Figure 4B:
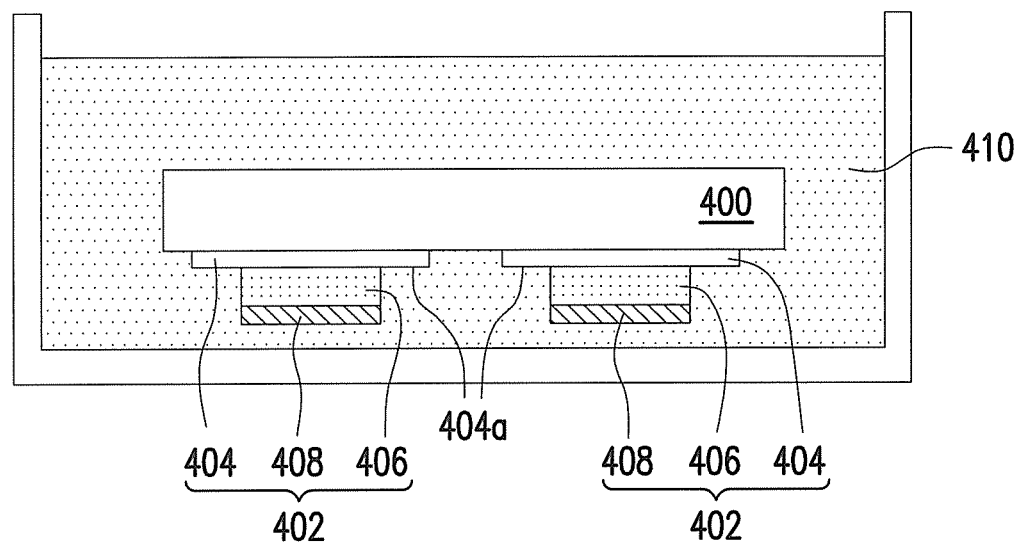

FIGS. 4A, 4B and 5 are schematic cross-sectional views illustrating the procedures for manufacturing electrochromic thin film of a photovoltaic electrochromic device according to the first embodiment of the present invention.

Referring to FIG. 4A, in the first embodiment, a single thin-film solar cell 402 is formed on a transparent substrate 400 first, wherein the transparent substrate 400 is, for example, a piece of glass or plastic or a flexible substrate. The thin-film solar cell 402 at least includes an anode 404, a photoelectric conversion layer 406, and a cathode 408, wherein a material of the anode 404 is, for example, a transparent conductive oxide (TCO) and a material of the cathode 408 is, for example, a TCO and a metal (e.g. silver, platinum or gold). In addition, a portion of a surface 404a of the anode 404 is exposed from the thin film solar cell 402. Alternatively, the photovoltaic electrochromic device in the first embodiment may includes a plurality of thin-film solar cells 402 as shown in FIG. 4B.

In the first embodiment, the anodes 404 are disposed discontinuously, but the present invention is not limited thereto. In particular, the anodes 404 can be formed as one continuous layer to increase the total current generated by the thin-film solar cells 402. Such parallel connection increases the current effectively. The anode 404 and the cathode 408 of the thin-film solar cells are formed in arrays. Each pair of anode 404 and cathode 408 will automatically generate potential different when being illuminated, without having any electrical connection between the anode 404 and the cathode 408.

The thin-film solar cells 402, as mentioned above, can be silicon thin-film solar cells, CIGS thin-film solar cells, CdTe thin-film solar cells, CIGS tandem thin-film solar cells, CdTe tandem thin-film solar cells, CIGS multijunction thin film solar cells, CdTe multijunction thin film solar cells, wherein the silicon thin-film solar cells includes a-Si thin-film solar cells, a-Si/mc-Si tandem thin-film solar cells, a-Si/a-Si tandem thin-film solar cells or multi junction a-Si thin film solar cells.

Then, electroplating or other film forming methods can be adopted to deposit an electrochromic thin film on at least one surface of the cathode 408 and the exposed surface 404a of the anode 404. For example, a composition of the electrochromic thin film includes conducting polymer, transition metal oxide, Prussian blue, or transition metal. In this embodiment, the electroplating is used as an example. Referring to FIG. 4B again, the transparent substrate 400 with the thin-film solar cells 402 formed thereon is soaked into an electroplating solution 410, such that the anodes 404 and the cathodes 408 of the thin-film solar cells 402 are in contact with the electroplating solution 410. The aforementioned electroplating solution 410 is, for example, formed by conducting polymers or viologens solutions such as, aniline monomer, EDOT monomer, or viologen monomer, and transition metal oxide electroplating solution, such nickel oxyhydroxide solution and ferric-ferrocyanide chromophore (Prussian Blue) solution.

Figure 5A:
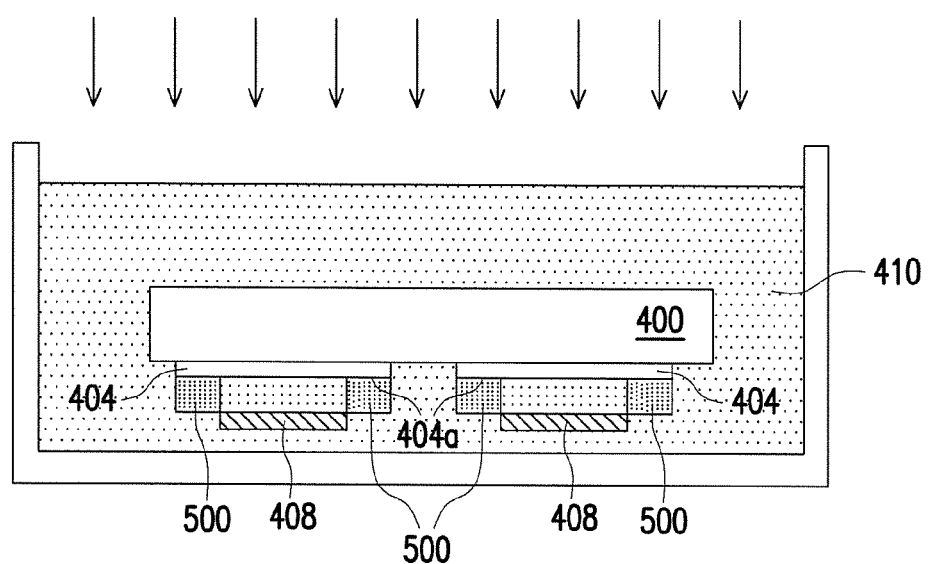
Figure 5B:
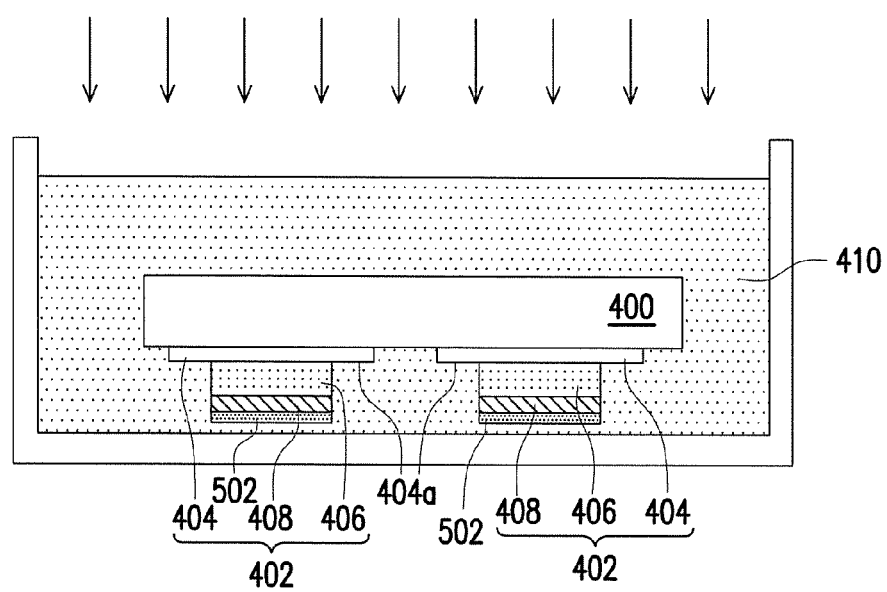

Thereafter, referring to FIG. 5A, the thin-film solar cells 402 soaked in the electroplating solution 410 are illuminated (the direction of light is indicated by the arrow in FIG. 5A) to generate current, which causes redox reaction in the electroplating solution 410. As a result, an electrochromic thin film 500 is formed on the exposed surface 404a of each of the anodes 404. Such a process is called anodic photoelectroplating. In addition, a process called cathodic photoelectroplating can be utilized to form the electrochromic thin film 502 on the surface of each of the cathodes 408 as shown in FIG. 5B. For instance, a composition in anodic photoelectroplating of the electrochromic thin film 500 comprises of electrochemical polymerization of poly aniline or electrodepostion of nickel oxyhydroxide thin film. A voltage for depositing the foregoing electroplating solutions is about 0.6-1.8 volt. Alternatively, the composition in cathodic photoelectroplating of the electrochromic thin film on the surface of each of the cathodes 408 can be Prussian blue or $WO_3$ obtained by a reaction of ferric-ferrocyanide chromophore or peroxytungstate solution, respectively. A redox potential of the above inorganic materials is about 0.5-2 volt.

Figure 6:
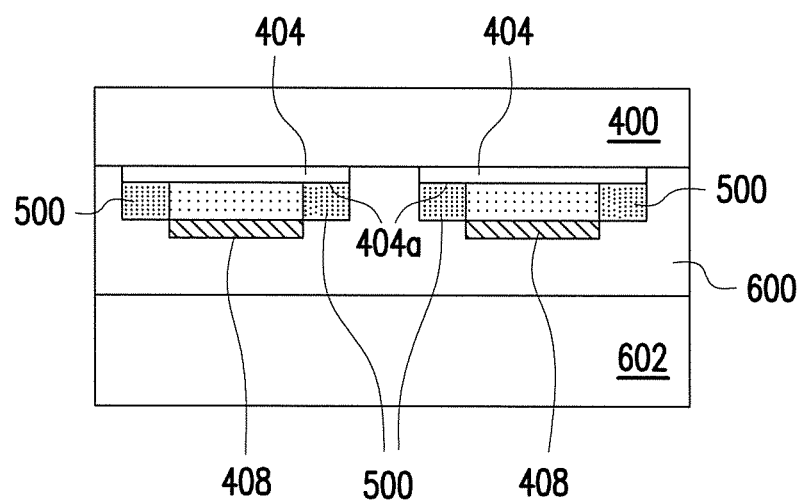

Besides the method mentioned in FIG. 5A and the first embodiment, another method can also be used to achieve the contact of the electroplating solution 410 and the anodes 404 and the cathodes 408 of the thin-film solar cells 402. The method includes spreading an electroplating solution 600 onto a transparent substrate 602 and then covering the thin-film solar cells thereon (as shown in FIG. 6).

The method of manufacturing photovoltaic electrochromic device, as described above, basically utilizes the electricity generated by the thin-film solar cells to perform electroplating, so as to simplify the manufacturing procedures and form the structure that the anodes and the cathodes of the thin-film solar cells also serve as the anodes and the cathodes of the electrochromic thin films. The conventional electroplating method passes current through electrodes, so as to respectively deposit electrochromic thin films on the surfaces of transparent conductive substrates. Therefore, the electrochromic thin film on a substrate has single polarity. By contrast, in the first embodiment of the present invention, the thin-film solar cells are used to perform electroplating. When being illuminated, the anodes and the cathodes of the thin-film solar cells simultaneously generate electrons and holes, which cause the electroplating solution to react and deposit on both the anodes and the cathodes. Based on the above, when the thin-film solar cells are formed on a single transparent substrate, the anodes and the cathodes of the electrochromic thin films are simultaneously formed on the surfaces of the anodes and the cathodes of the solar cells.

Moreover, the electrochromic thin film can also be deposited by vacuum deposition techniques. A material of the electrochromic thin film is, for example, a transition metal oxide or a transition metal, wherein the transition metal oxide is selected from a group consisting of $WO_3$, $MoO_3$, $V_2O_5$, $Nb_2O_5$, NiO, SnO, $Fe_2O_3$, CoO, $Ir_2O_3$, $Rh_2O_3$, and $MnO_2$; and the transition metal is selected from metal, alloy, hydride, chalcogenide or telluride formed from a group of transition metal consisting of Mn, Mg, Co, Cu, Ni, Zn, V, Cr, Fe, Bi, Sb, Au, Zn, Pt, Ag, Ti, Nb, Te and Se. For example, the transition metal hydride is selected from a group consisting of Sb-Cu, Sb-Al, Mg, Mg-Ti and Mg-Ni, the transition metal chalcogenides is selected from a group consisting of NbSe or $TiS_2$, or the transition metal tellurides is selected from a group consisting of $NbTe_2$. The transition metal thin film changes its optical properties upon exposure to dilute hydrogen gas or by contacting the transition metal thin film to alkaline electrolyte.

The method of depositing the transition metal oxide is, for instance, electron beam evaporation, thermal evaporation, ion-assisted coating, reactive and non-reactive sputtering, CVD, plasma enhanced CVD or atmospheric pressure CVD. Moreover, in the forming procedures, a mask can be utilized to vary the deposition position (on the surface of the anode 404 and/or the cathode 408, for example).

FIGS. 7A, 7B, 8, and 9 are schematic cross-sectional views illustrating three succeeding procedures, as alternatives, for manufacturing the photovoltaic electrochromic device according to the first embodiment of the present invention.

Figure 7A:
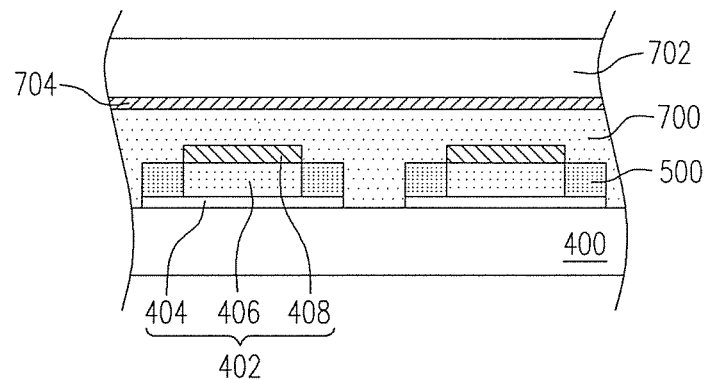
FIGS. 7A, 7B, 8, and 9 are schematic cross-sectional views illustrating three succeeding procedures, as alternatives, for manufacturing the photovoltaic electrochromic device according to the first embodiment of the present invention.

Referring to FIG. 7A, the electroplating solution in FIG. 5A is removed first, and an electrolyte layer 700 is formed on the surface of the transparent substrate 400 to cover the electrochromic thin film 500. The electrolyte layer 700 in FIG. 7A is liquid electrolyte, which includes an alkali metal salt and a solvent. For example, the alkali metal salt includes lithium trifluoromethylsulfonate, lithium perchlorate, bis(trifluoroethylsulfonyl)imide or tetra alkyl ammonium salt; and the solvent includes propylene carbonate, dipropyl carbonate, glycol carbonate, γ-butyrolactone, acetonitrile, tetrahydrofuran, or N-methyl-2-pyrrolidone. The anode 404 and the cathode 408 of each of the thin-film solar cells 402 also serve as the anode and the cathode of the photovoltaic electrochromic device. After forming the electrolyte layer 700, a transparent non-conductive substrate 702 is disposed to cover the electrolyte layer 700, wherein the transparent non-conductive substrate 702 includes a piece of glass or plastic or a flexible substrate. Furthermore, a reflective film 704 can be formed on either sides of the surface of the transparent non-conductive substrate 702. The reflective film 704 is, for example, silver, chromium or aluminum to form a mirror.

Figure 7B:
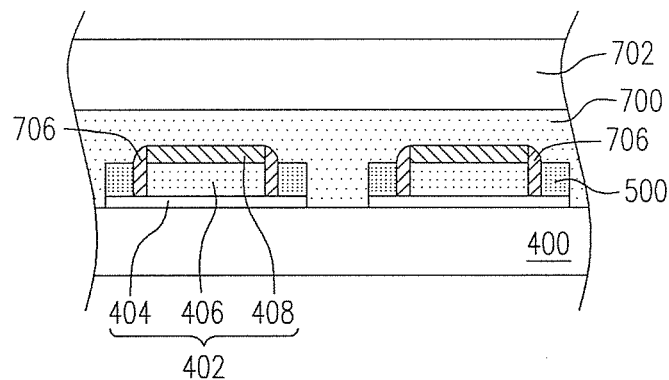

Finally, referring to FIG. 7A again, a resin such as epoxy resin (not shown) is utilized to bond the substrate 400, on which the thin-film solar cells 402 are formed, to the transparent non-conductive substrate 702. Glass beads (not shown) are mixed with the resin to serve as spacers for maintaining a gap between the transparent substrate 400 and the transparent non-conductive substrate 702, so as to constitute the photovoltaic electrochromic device. To prevent the thin-film solar cells 402 from being eroded by the solvent, a process of forming a passivation layer 706, as shown in FIG. 7B, on a sidewall of the photoelectric conversion layer 406 can be carried out when forming the thin-film solar cells 402.

When illuminated by sunlight, the thin-film solar cells generate electron-hole pairs which cause the electrochromic thin film 500 to change color due to redox reaction. Because the thin-film solar cells 402 are designed to be distributed as arrays or stripes on the transparent substrate 400, the electric fields in the peripheral area and the center area are uniform, with a result that the color density in the peripheral and the center areas of the photovoltaic electrochromic device are the same, regardless of the size of the device.

Figure 8:
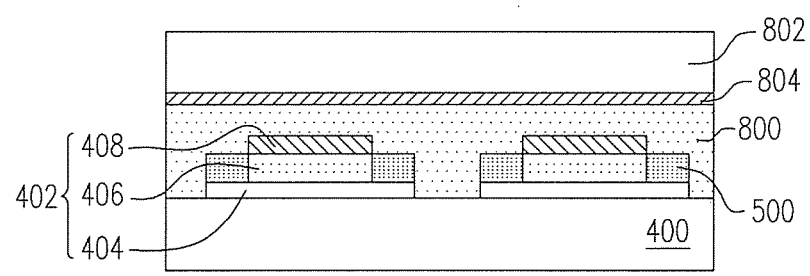
Figure 9:
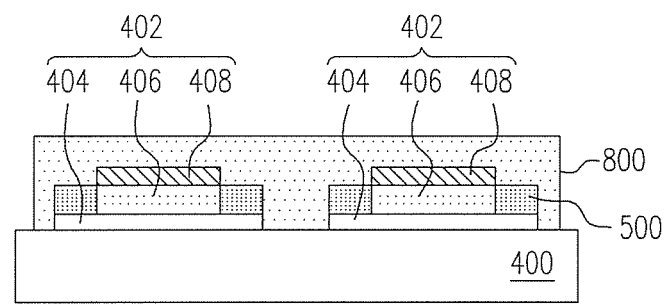

In addition, referring to FIG. 8, if required, a solid electrolyte 800 can be formed on the surface of the transparent substrate 400 after the electroplating solution in FIG. 5A (or FIG. 6) is removed. Because the electrolyte layer in FIG. 8 is solid electrolyte 800, the possibility of eroding the thin-film solar cells is greatly reduced, and the reliability of the device is enhanced. For instance, a polymer of the solid electrolyte 800 includes Poly(ethylene oxide), Poly(propylene oxide), Poly(vinyl butyral), or Poly(methyl methacrylate). Then, a transparent non-conductive substrate 802 (glass, plastic, or a flexible substrate, for example) is disposed to cover the solid electrolyte 800, and a reflective film 804 can be formed on the transparent non-conductive substrate 802; or alternatively, the solid electrolyte 800 covers the electrochromic thin film 500 and the thin-film solar cells 402 without having the transparent non-conductive substrate 802 thereon, as shown in FIG. 9.

Moreover, the solid electrolyte 800 can also be electrolytic deposited on the surface of the transparent substrate 400 after the electroplating solution in FIG. 5A (or FIG. 6) is removed. The electrolytic deposited electrolyte layer includes Li3PO4 thin film, for example.

Moreover, the solid electrolyte 800 can also be successively vacuum deposited on the surface of the transparent substrate 400 after the vacuum deposition of a transition metal oxide used as the electrochromic thin film. The solid electrolyte 800 may be an inorganic electrolyte such as $Li_xTaO_y$, $Ta_2O_5$, $ZrO_2$ and so on. After forming the solid electrolyte 800, a machine such as a laminator or an autoclave may be utilized to compress and bond the transparent substrate 400, the solid electrolyte layer 800, an encapsulation material (not shown) and the transparent non-conductive substrate 802 together, so as to encapsulate the photovoltaic electrochromic device.

Figure 10A:
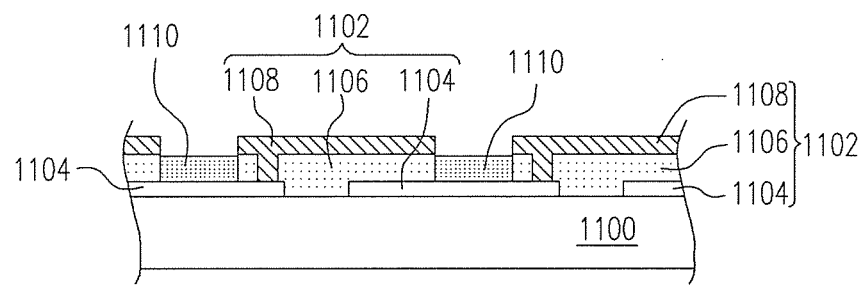
FIGS. 10A, 10B, and 10C are schematic cross-sectional views illustrating the procedures for manufacturing a photovoltaic electrochromic device according to the second embodiment of the present invention.
Figure 10B:
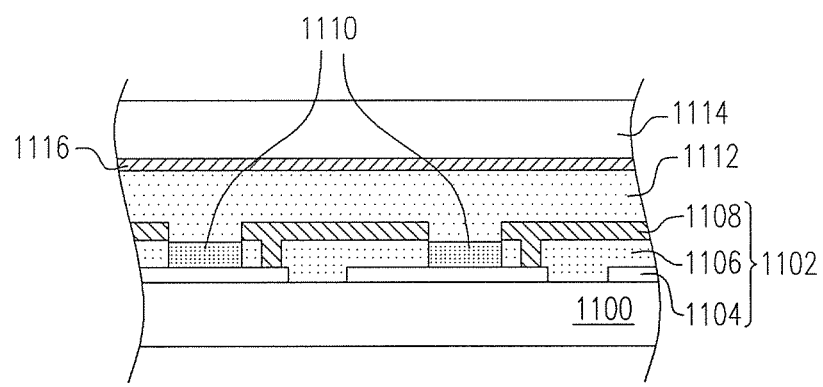

FIGS. 10A and 10B are schematic cross-sectional views illustrating the procedures for manufacturing a photovoltaic electrochromic device according to the second embodiment of the present invention.

Figure 10C:
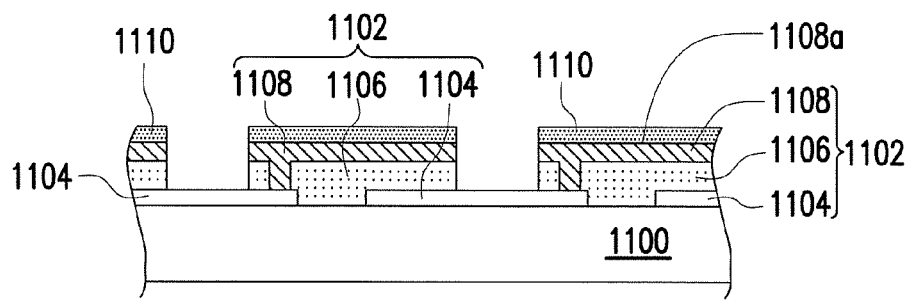

With reference to FIG. 10A, in the second embodiment, a plurality of thin-film solar cells 1102 are formed on a transparent substrate 1100 first, wherein each of the thin-film solar cells 1102 at least includes an anode 1104, a photoelectric conversion layer 1106, and a cathode 1108. The thin-film solar cells 1102 can be connected in series. The type of the thin-film solar cells 1102 and the materials of the transparent substrate 1100, the anode 1104, the photoelectric conversion layer 1106 and the cathode 1108 have been described in the first embodiment. Then, the method as illustrated in FIG. 10A is carried out to form an electrochromic thin film 1110 on a surface of the anode 1104. In this embodiment, each of the anodes 1104 is exposed between the cathodes 1108, and thus a shading area of the electrochromic thin film 1110 is determined by the width of an interval between the cathodes 1108. Certainly, the electrochromic thin film 1110 can also be formed on a surface 1108a of the cathode 1108 as shown in FIG. 10C. A composition of the electrochromic thin film 1110 has been described in the first embodiment.

Thereafter, referring to FIG. 10B, an electrolyte layer 1112 is formed on a surface of the transparent substrate 1100 to cover the electrochromic thin film 1110. The electrolyte layer 1112 in FIG. 10B is liquid electrolyte, and a composition thereof has been described in the first embodiment. In the meantime, the anode 1104 and the cathode 1108 of each of the thin-film solar cells 1102 serve as the anode and the cathode of the photovoltaic electrochromic device. After forming the electrolyte layer 1112, a transparent non-conductive substrate 1114 needs to be disposed to cover the electrolyte layer 1112. Certainly, a reflective film 1116 can be formed on the transparent non-conductive substrate 1114, as described in the previous embodiment. Finally, a resin such as epoxy resin (not shown) is utilized to bond the substrate 1100, on which the thin-film solar cells 1102 are formed, to the transparent non-conductive substrate 1114. Glass beads (not shown) are mixed with the resin to serve as spacers for maintaining a gap between the transparent substrate 1100 and the transparent non-conductive substrate 1114, so as to constitute the photovoltaic electrochromic device.

Figure 11:
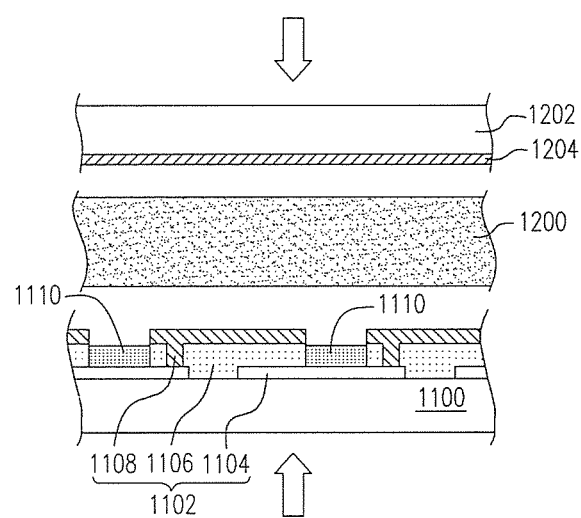
FIG. 11 is a schematic cross-sectional view illustrating an alternative succeeding procedure for manufacturing the photovoltaic electrochromic device according to the second embodiment of the present invention.

If the electrolyte layer in FIG. 10B is solid electrolyte, the process of forming an electrolyte layer 1200 may include stacking a transparent non-conductive substrate 1202 on the electrolyte layer 1200 disposed on the transparent substrate 1100, and then compressing and bonding the transparent substrate 1100, the electrolyte layer 1200, and the transparent non-conductive substrate 1202 together with a laminator or an autoclave as shown in FIG. 11. Accordingly, the photovoltaic electrochromic device is encapsulated. In other words, the electrolyte layer 1200 can also behave as an adhesive in this case. As described in the previous embodiment, a reflective film 1204 can also be formed on a surface of the transparent non-conductive substrate 1202.

Figure 12A:
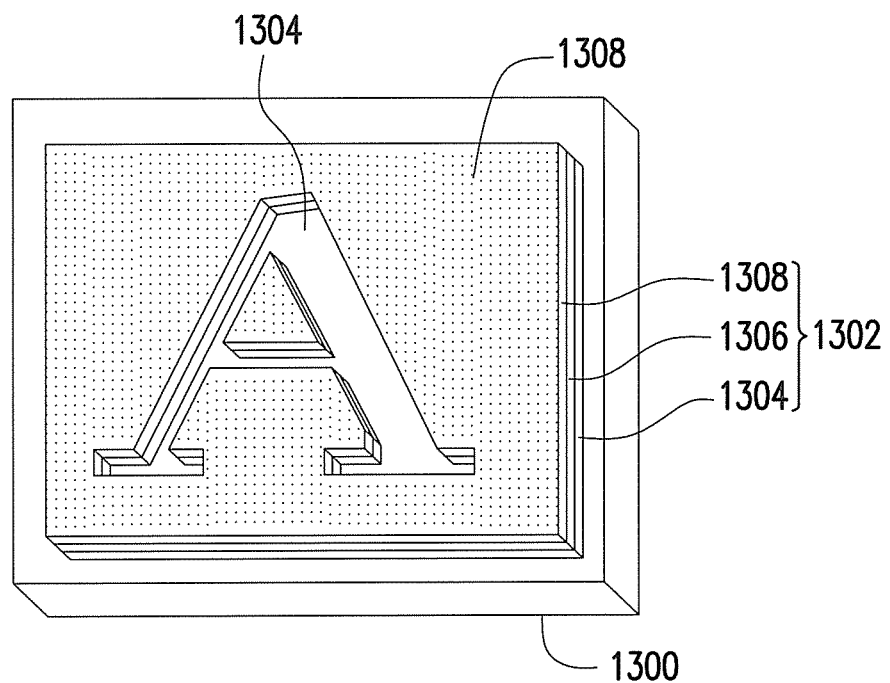
FIG. 12A and 12B are two kinds of photovoltaic electrochromic device according to the third embodiment of the present invention.
Figure 12B:
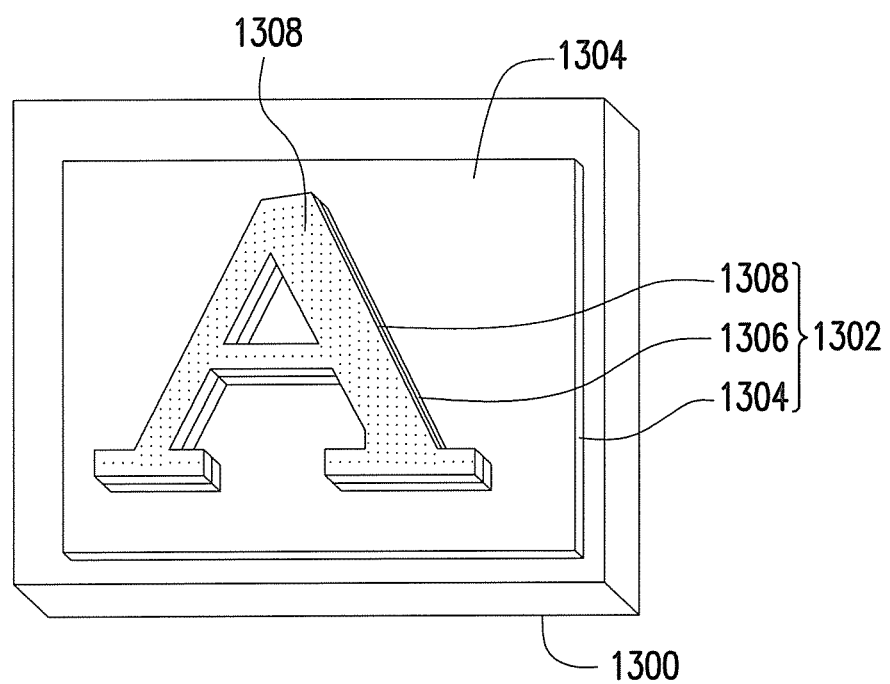

FIG. 12A is a photovoltaic electrochromic device according to the third embodiment of the present invention. FIG. 12B is another photovoltaic electrochromic device of the third embodiment of the present invention.

With reference to FIG. 12A and FIG. 12B, in the third embodiment, a patterned thin-film solar cell 1302 is formed on a transparent substrate 1300, wherein the thin-film solar cell 1302 at least includes an anode 1304, a photoelectric conversion layer 1306, and a cathode 1308. The method of forming the patterned thin film solar cell 1302 includes a laser ablation and sand blasting methods to remove a portion of the photoelectric conversion layer 1306 and the cathode 1308. The type of the thin-film solar cell 1302 and the material of the transparent substrate 1300, the anode 1304, the photoelectric conversion layer 1306 and the cathode 1308 have been described in the first embodiment. Then, the method as illustrated in FIG. 4A, FIG. 5A and FIG. 6 are carried out to form an electrochromic thin film (not shown) on a surface of the anode 1304. In this embodiment, the anode 1304 is exposed from the cathode 1308, and thus a potential different built between the anode 1304 and the cathode 1308 under sun illumination determines the color tint of the electrochromic thin film. Certainly, the electrochromic thin film can also be formed on a surface of the cathode 1307. A composition of the electrochromic thin film has been described in the first embodiment. A transparent non-conductive substrate and an electrolyte layer are then stacked respectively on the thin film solar cell.

Several experiments as described below have been carried out to prove the efficiency of the present invention. A silicon thin-film solar cell is applied as an example in the experiments.

Procedures I

Figure 13:
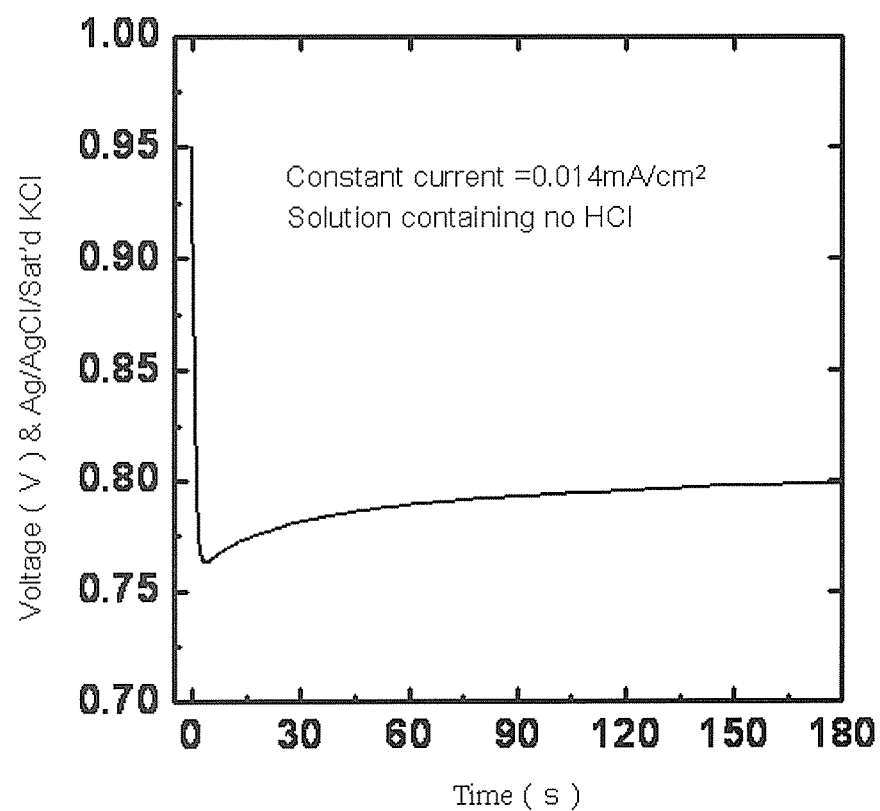
FIG. 13 depicts a scan of galvanostatic electrodeposition curve of a Prussian blue.
Figure 14:
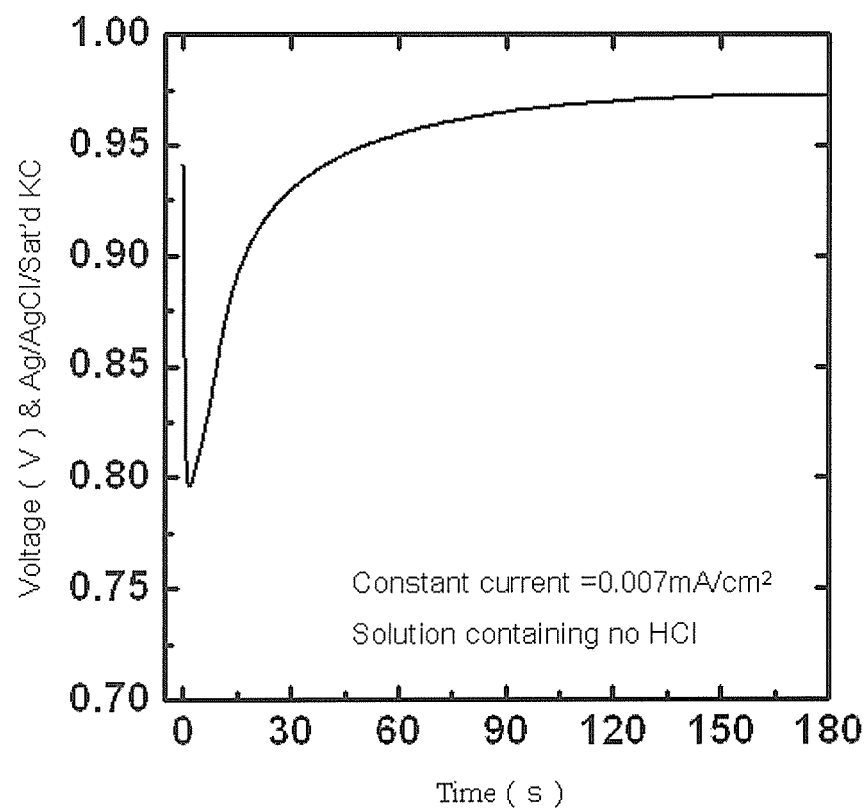
FIG. 14 depicts another scan of galvanostatic electrodeposition curve of Prussian blue.

Determination of Voc requirement for photoelectroplating process. 10 mM of $K_3Fe(CN)_6$ is added into 50 ml of DI-water, and 10 mM of $FeCl_3$ and 10 mM of KCl are added into 50 ml of DI-water, so as to obtain two solutions. The two solutions are mixed in a volume ratio of 1:1. Next, an Autolab PGSTAT30 electrochemical analyzer is utilized to perform a galvanostatic electrodeposition of Prussian Blue thin film. A counter electrode is a platinum electrode and a reference electrode is Ag/AgCl. Constant currents of 0.014 mA/cm$^2$ and 0.007 mA/cm$^2$ are respectively inputted to form Prussian blue thin films. The scan ranges are shown in FIGS. 13 and 14. Based on the diagrams, the electrodeposition potential of Prussian Blue films ranges from 0.8-0.95 volt. Accordingly, if silicon thin-film solar cells are used to electroplate Prussian Blue films, a Voc value requirement is about 0.8-0.95 volt.

Procedures II

Figure 15:
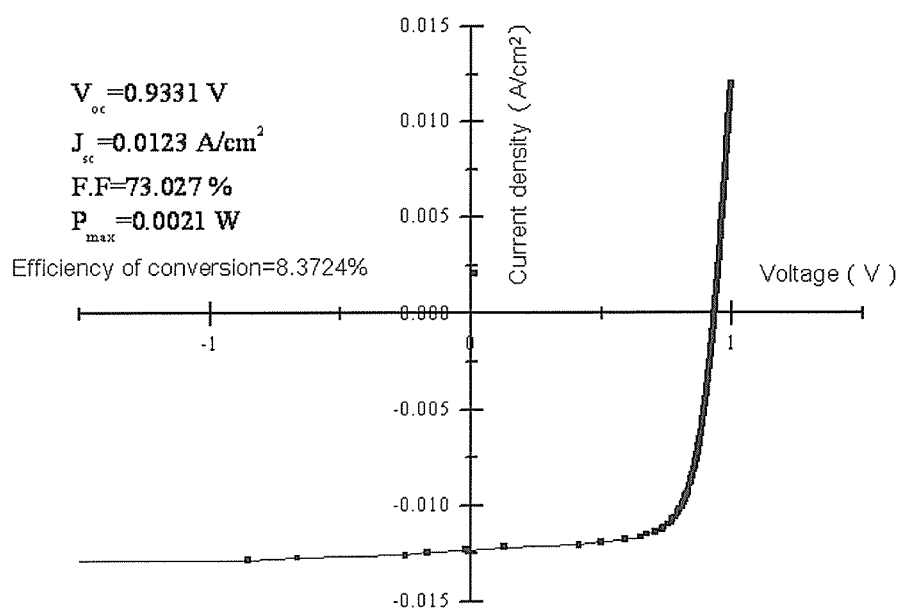
FIG. 15 is an IV curve diagram depicting the characteristics of photoelectric conversion of the silicon thin-film solar cell in Procedures II.

Photoelectroplating is carried out by solar simulator. First, 10 mM of $K_3Fe(CN)_6$ is added into 50 ml of DI-water, and 10 mM of $FeCl_3$ and 10 mM of KCl are added into 50 ml of DI-water, so as to obtain two solutions. The two solutions are mixed in a volume ratio of 1:1. In the meantime, a 5 cm×5 cm first transparent glass substrate is provided. A solution, i.e. a mixture of the aforementioned two solutions, is spread on the first glass substrate. Further, a 5 cm×5 cm second transparent glass substrate having silicon thin-film solar cells formed thereon is covered onto the first transparent glass substrate. The silicon thin-film solar cells are formed in array, and each array has an area of 0.25 cm$^2$. An open circuit voltage Voc of the silicon thin-film solar cell is 0.933 V, a current density Jsc is 0.0123 A/cm$^2$, FF is 73.03%, Pmax is 2.1 mW, and the efficiency is 8.37%. The characteristics of photoelectric conversion of the silicon thin-film solar cell is represented by an IV curve of FIG. 15. The above-described photovoltaic electrochromic device is placed in a Peccell Pec-L11 solar simulator for illumination. In five minutes, cathodic photoelectrodeposition of the electroplating solution occurs under the cathodes of the silicon thin-film solar cells, and the color of the cathodes gradually changes to light blue. After being washed by water, light blue thin films remain on the cathodes, proving that Prussian Blue thin films have been plated on the surfaces of the cathodes.

Procedures III

Photoelectroplating is carried out under sunlight. 4.55 ml of 0.1M aniline monomer and 10.1 ml of 2M HCl (37%) are added to DI water to obtain an overall of 50 ml aniline electroplating solution. Next, a 5 cm×5 cm first transparent glass substrate is provided, and the aniline solution is spread on the first glass substrate. Furthermore, a 5 cm×5 cm second transparent glass substrate having silicon thin-film solar cells formed thereon is disposed to cover the first transparent glass substrate.

The foregoing silicon thin-film solar cells are formed in array, and each array has an area of 0.25 cm$^2$. An open circuit voltage Voc of the silicon thin-film solar cell is 0.933 V, a current density Jsc is 0.0123 A/cm$^2$, FF is 73.03%, Pmax is 2.1 mW, and the efficiency is 8.37%. When the silicon thin-film solar cells are illuminated by sunlight, in five minutes, an anodic photoelectrodeposition of the aniline monomer occurs below the anodes of the silicon thin-film solar cells. The color of the anodes gradually changes from transparent to yellow green, representing the existence of poly aniline thin film. As the time of photoelectroplating increases, the thin films become thicker and the color of the anodes turns to green.

Procedures IV

Figure 16:
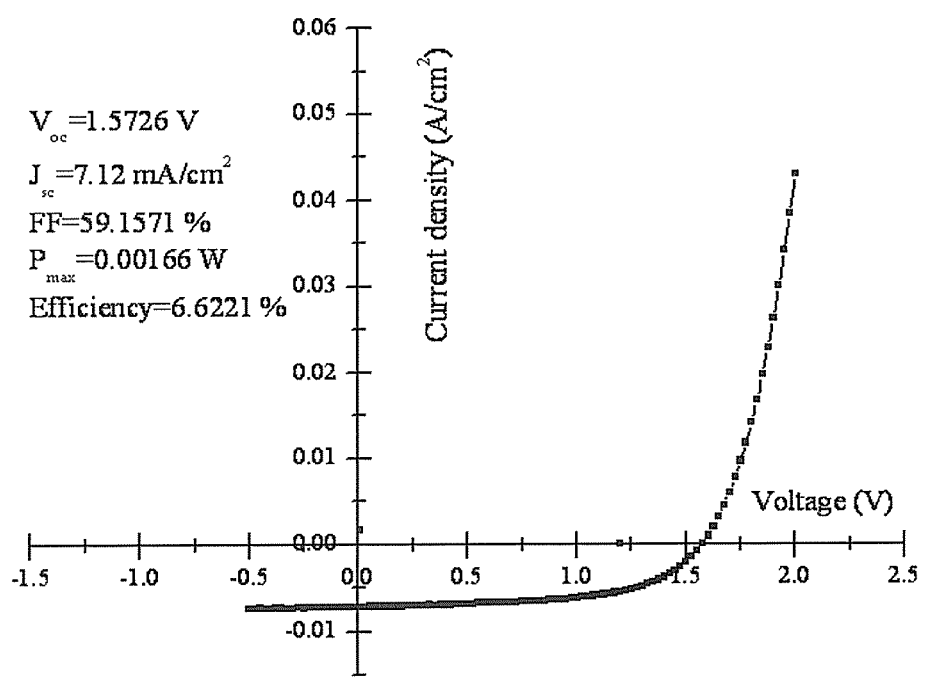
FIG. 16 is an IV curve diagram depicting the characteristics of photoelectric conversion of the silicon thin-film solar cell in Procedures IV.

Photoelectroplating is carried out under sunlight. 53 μl of 0.01M 3,4-ethylenedioxythiophene (EDOT) monomer and 530 mg of 0.1M LiClO$_4$ are added into 50 ml of acetonitrile, so as to obtain an EDOT electroplating solution. Then, a 5 cm×5 cm first transparent glass substrate is provided, and the EDOT solution is spread on the first glass substrate. Furthermore, a 5 cm×5 cm second transparent glass substrate having silicon thin-film solar cells formed thereon is disposed to cover the first transparent glass substrate. The aforementioned silicon thin-film solar cells are formed in array, and each array has an area of 0.25 cm$^2$. An open circuit voltage Voc of the silicon thin-film solar cell is 1.57 V, a current density Jsc is 7.12 mA/cm$^2$, FF is 59.16%, Pmax is 1.67 mW, and the efficiency is 6.62%. The characteristics of photoelectric conversion of the silicon thin-film solar cell are represented by an IV curve of FIG. 16. When the silicon thin-film solar cells are illuminated by sunlight, in ten minutes, and anodic photoelectrodeposition of the EDOT monomer occurs below the anodes of the silicon thin-film solar cells. The color of the anodes gradually changes from transparent to light blue, which represents the color of PEDOT thin film.

Procedures V

Photoelectroplating is carried out in the solar simulator. 53 μl of 0.01M EDOT monomer and 530 mg of 0.1M LiClO4 are added into 50 ml of acetonitrile, so as to obtain an EDOT electroplating solution. Then, a 5 cm×5 cm first transparent glass substrate is provided, and the EDOT solution is spread on the first glass substrate. Further, a 5 cm×5 cm second transparent glass substrate having silicon thin-film solar cells formed thereon is disposed to cover the first transparent glass substrate. The silicon thin-film solar cells are formed in array, and each array has an area of 0.25 cm$^2$.

An open circuit voltage Voc of the silicon thin-film solar cell is 1.58 V, a current density Jsc is 6.86 mA/cm$^2$, FF is 58.69%, Pmax is 1.59 mW, and the efficiency is 6.38%. The above-described photovoltaic electrochromic device is placed in the Peccell Pec-L11 solar simulator for illumination. In ten minutes, an anodic photoelectrodeposition of the EDOT monomer occurs below the anodes of the silicon thin-film solar cells, and the color of the anodes gradually changes from transparent to light blue.

Procedures VI

Figure 17:
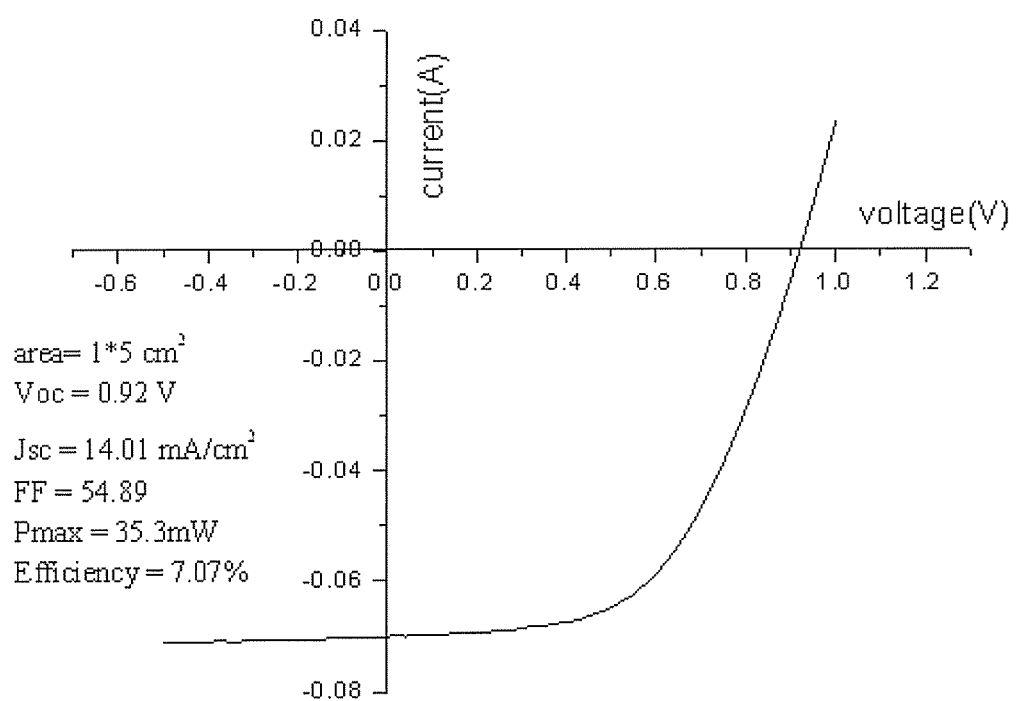
FIG. 17 is an IV curve diagram depicting the characteristics of photoelectric conversion of the silicon thin-film solar cell in Procedures VI.

Photoelectroplating is carried out in the solar simulator. 9.1 ml of 0.1M aniline monomer and 20.2 ml of 2M HCl (37%) are added to obtain an overall of 61.7 ml aniline electroplating solution. Then, a 5 cm×5 cm first transparent glass substrate is provided, and the aniline solution is spread on the first glass substrate. Further, a 5 cm×5 cm second transparent glass substrate having silicon thin-film solar cells formed thereon is disposed to cover the first transparent glass substrate. The silicon thin-film solar cells are formed in stripe, and each stripe has an area of 1×5 cm$^2$. An open circuit voltage Voc of the silicon thin-film solar cell is 0.92V, a current density Jsc is 14.01 mA/cm$^2$, FF is 54.89%, Pmax is 35.3 mW, and the efficiency is 7.07%. The characteristics of photoelectric conversion of the silicon thin-film solar cell is represented by an IV curve of FIG. 17. The interval between each stripe is 0.5 cm. The above-described photovoltaic electrochromic device is placed in the Peccell Pec-L11 sunlight simulator for illumination. In five minutes, an anodic electrodeposition of the aniline monomer occurs below the anodes of the silicon thin-film solar cells, and the color of the anodes gradually changes from transparent to yellow green.

Procedures VII

Photoelectroplating is carried out in the solar simulator. Electrodeposition of NiOOH (Nickel oxyhydroxide) thin film is conducted by preparing 0.005 M of $NiSO_4.6H_2O$ and 0.015M of $(NH_4)2SO_4$ under pH>8. Then, a 5 cm×5 cm first transparent glass substrate is provided, and the solution is spread on the first glass substrate.

Further, a 5 cm×5 cm second transparent glass substrate having silicon thin-film solar cells formed thereon is disposed to cover the first transparent glass substrate. The silicon thin-film solar cells are formed in array, and each array has an area of 0.25 cm$^2$. The open circuit voltage Voc of the silicon thin-film solar cell is 0.93V, the current density Jsc is 12.29 mA/cm$^2$, FF is 73.03%, Pmax is 2.1 mW, and the efficiency is 8.37%. The above-described photovoltaic electrochromic device is placed in the Peccell Pec-L11 sunlight simulator for illumination. In ten minutes, an anodic photoelectrodeposition of the nickel electroplating solution occurs below the anodes of the silicon thin-film solar cells, and the color of the anodes gradually changes from transparent to brown. The Nickel oxyhydroxide thin film is then dried and annealed for 30 minutes in air at above 200° C. The color of the thin film return to transparent after the heating step.

Experiment I

Figure 18:
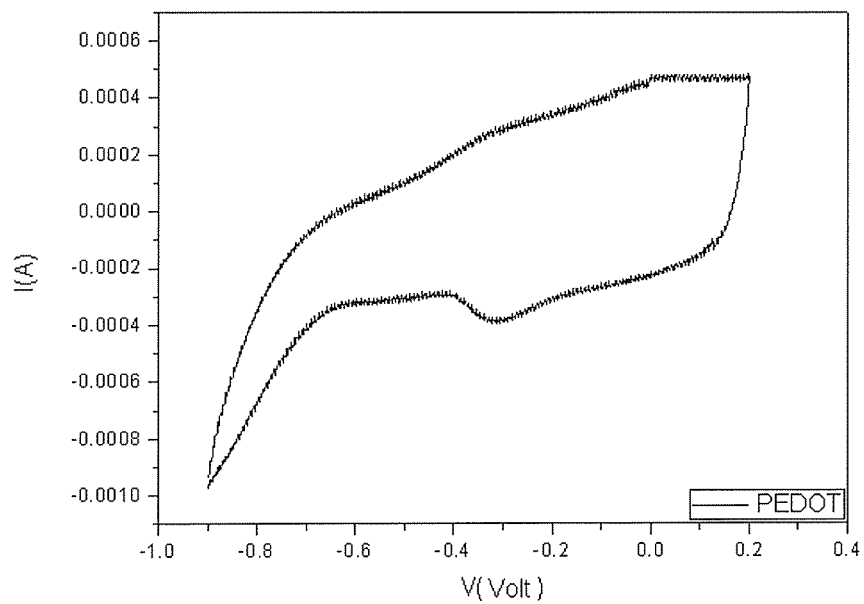
FIG. 18 is a CV curve diagram of a photovoltaic electrochromic device, which utilizes PEDOT as electrochromic thin films, in Experiment I.

Experiment I is to examine the characteristics of redox reaction of photovoltaic electrochromic thin film. 0.1M of TBABF4 (tetrabutylammonium tetrafluoroborate) is dissolved in 100 ml of propylene carbonate solvent. The result of Procedures V is used as a working electrode, and an Autolab PGSTAT30 electrochemical analyzer is utilized to perform a CV (cyclic voltammogram) curve scan. The counter electrode is platinum and the reference electrode is Ag/AgCl. The scan range is shown in FIG. 18. A curve depicting the CV curve scan indicates that the color of the PEDOT thin films (i.e. the electrochromic thin films of the present invention), which has turned to bluish color, gradually returns to transparent in oxidation state. The result of the examination proves that PEDOT is a material capable of being photoelectroplated by thin film solar cells and changed color by CV cycling.

Experiment II

Figure 19:
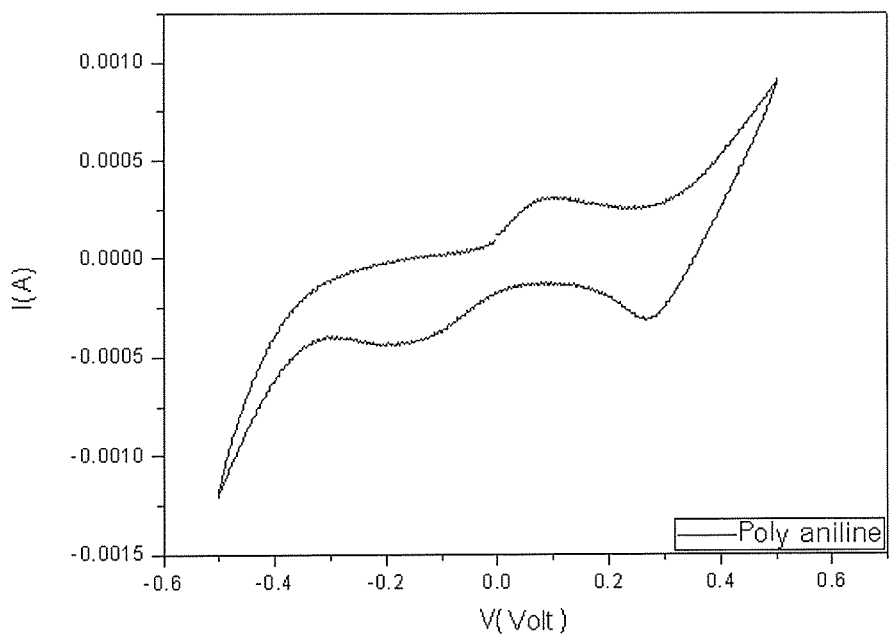
FIG. 19 is a CV curve diagram of a photovoltaic electrochromic device, which utilizes poly aniline as electrochromic thin films, in Experiment II.

Experiment II is to examine the characteristics of redox reaction of photovoltaic electrochromic thin films. 0.1M of TBABF4 is dissolved in 100 ml of propylene carbonate solvent. Then, the result of Procedures VI is used as a working electrode, and an Autolab PGSTAT30 electrochemical analyzer is utilized to perform a CV (cyclic voltammogram) curve scan. The counter electrode is platinum and the reference electrode is Ag/AgCl. The scan range is shown in FIG. 19. A curve depicting the CV curve scan indicates that the color of the poly aniline thin films (i.e. the electrochromic thin films of the present invention), which has changed from yellow green to green in oxidation state, gradually returns to yellow green in reduction state. The result of the examination proves that poly aniline is a material capable of being photoelectroplated by thin film solar cell and changed color by CV cycling.

Experiment III

Experiment III is to examine photoelectroplating and color change under illumination of the solar simulator. 9.1 ml of 0.1M aniline monomer and 20.2 ml of 2M HCl (37%) are added into 61.7 ml of DI-water, so as to obtain an aniline electroplating solution. Then, a 5 cm×5 cm first transparent glass substrate is provided, and the aniline solution is spread on the first glass substrate. In addition, a 5 cm×5 cm second transparent glass substrate having silicon thin-film solar cells formed thereon is disposed to cover the first transparent glass substrate. The silicon thin-film solar cells are formed in stripe, and each stripe has an area of 1×5 cm$^2$. An open circuit voltage Voc of the silicon thin-film solar cell is 0.92V, a current density Jsc is 14.01 mA/cm$^2$, FF is 54.89%, Pmax is 35.3 mW, and the efficiency is 7.07%. The interval between each stripe is 0.5 cm. The above-described photovoltaic electrochromic device is placed in the Peccell Pec-L11 solar simulator for illumination. In five minutes, the anodic photoelectrodeposition occurs below the anodes of the silicon thin-film solar cells, and the color of the anodes gradually changes from transparent to yellow green.

Thereafter, 0.1M of TBABF4 is dissolved in 100 ml of propylene carbonate solvent. Next, a 5 cm×5 cm third transparent glass substrate is provided, and the aforementioned electrolyte layer is applied on the third glass substrate. Further, a 5 cm×5 cm second transparent glass substrate, which includes silicon thin-film solar cells photoelectroplated with poly aniline, is disposed to cover the third transparent glass substrate, so as to constitute a photovoltaic electrochromic device.

The above-described photovoltaic electrochromic device is placed in the Peccell Pec-L11 solar simulator for illumination. In three minute, oxidation occurs below the anodes of the silicon thin-film solar cells, and the color of the anodes gradually changes from yellow green to green. If illumination is removed, the color of the photovoltaic electrochromic device returns to yellow green after a few seconds.

Experiment IV

Figure 20:
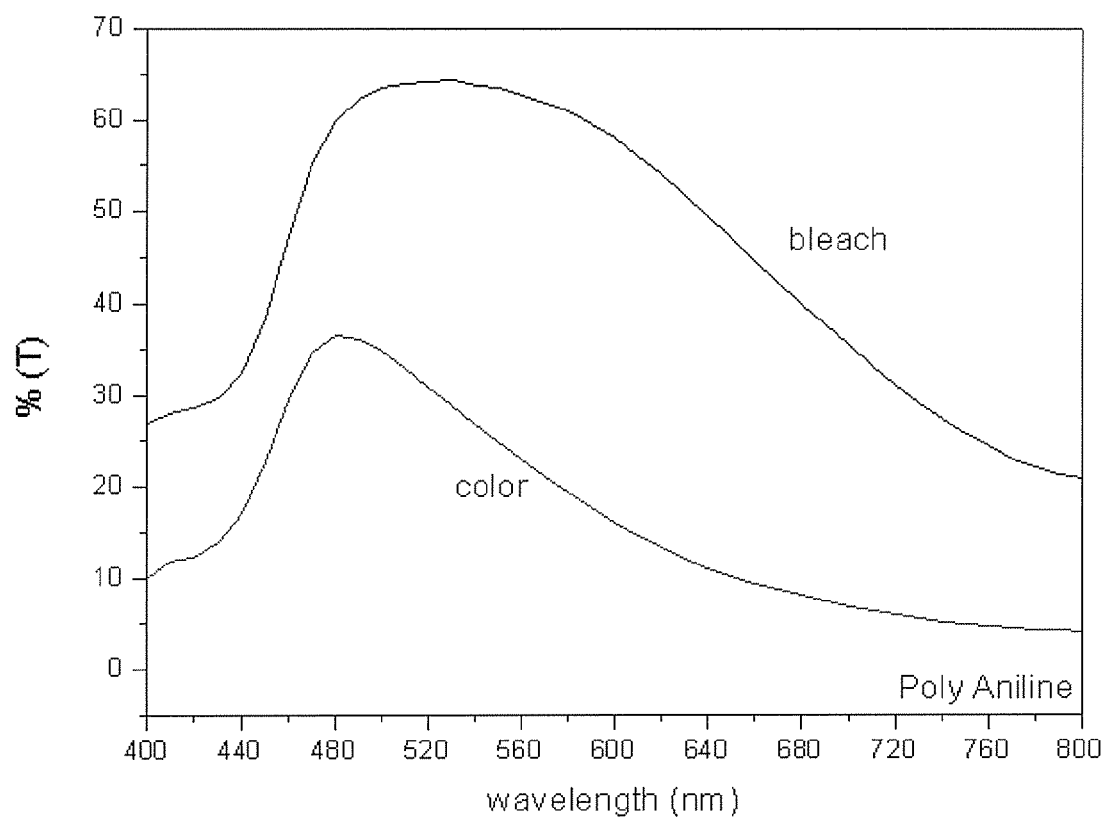
FIG. 20 is an optical transmittance of photovoltaic electrochromic device obtained from Experiment IV

Experiment IV is to examine the color/bleach change of photovoltaic electrochromic device under illumination. The optical transmittance of photovoltaic electrochromic device obtained from Experiment III is measured using a UV-VIS-NIR spectrophotometer (Perkin Elmer Lambda 750) in the wavelength range 400-800 nm. The amount of color/bleach state changes of the photovoltaic electrochromic after/before the illumination by solar simular is shown in FIG. 20. The result shows that the color contrast of the Poly Aniline thin film is over 30%.

Experiment V

Experiment V is to examine photoelectroplating and color change under illumination of the solar simulator. Electrodeposition of NiOOH (Nickel oxyhydroxide) film is conducted by preparing 0.005 M of NiSO$_4$.6H$_2$O and 0.015M of (NH$_4$)2SO$_4$ under pH>8. Then, a 5 cm×5 cm first transparent glass substrate is provided, and the solution is spread on the first glass substrate.

Further, a 5 cm×5 cm second transparent glass substrate having silicon thin-film solar cells formed thereon is disposed to cover the first transparent glass substrate. The silicon thin-film solar cells are formed in array, and each array has an area of 0.25 cm$^2$. The open circuit voltage Voc of the silicon thin-film solar cell is 0.93V, the current density Jsc is 12.29 mA/cm$^2$, FF is 73.03%, Pmax is 2.1 mW, and the efficiency is 8.37%. The above-described photovoltaic electrochromic device is placed in the Peccell Pec-L11 sunlight simulator for illumination. In ten minutes, an anodic photoelectrodeposition of the nickel electroplating solution occurs below the anodes of the silicon thin-film solar cells, and the color of the anodes gradually changes from transparent to brown. The Nickel oxyhydroxide thin film then dried and annealed for 30 minutes in air at above 200° C. The color of the anodes return to transparent after heating step.

Thereafter, 0.1M of KOH aqueous solution is prepared. Next, a 5 cm×5 cm third transparent glass substrate is provided, and the aforementioned electrolyte layer is applied on the third glass substrate. Further, a 5 cm×5 cm second transparent glass substrate, which includes silicon thin-film solar cell module photoelectroplated with Nickel oxyhydroxide, is disposed to cover the third transparent glass substrate, so as to constitute a photovoltaic electrochromic device. The above-described photovoltaic electrochromic device is placed in the Peccell Pec-L11 solar simulator for illumination. In ten minutes, oxidation occurs below the anodes of the silicon thin-film solar cells, and the color of the anodes gradually changes from transparent to brown. The result of the examination proves that Nickel oxyhydroxide is a material capable of being photoelectroplated by thin film solar cells and changed color by sun illuminations.

Experiment VI

Experiment VI is to examine photoelectroplating and color change under illumination of the solar simulator using series connected thin film solar cell module. Electrodeposition of poly aniline film is conducted by preparing 9.1 ml of 0.1M aniline monomer and 20.2 ml of 2M HCl (37%) which are added into 61.7 ml of DI-water, so as to obtain an aniline electroplating solution. Then, a 5 cm×5 cm first transparent glass substrate is provided, and the solution is spread on the first glass substrate.

Figure 21:
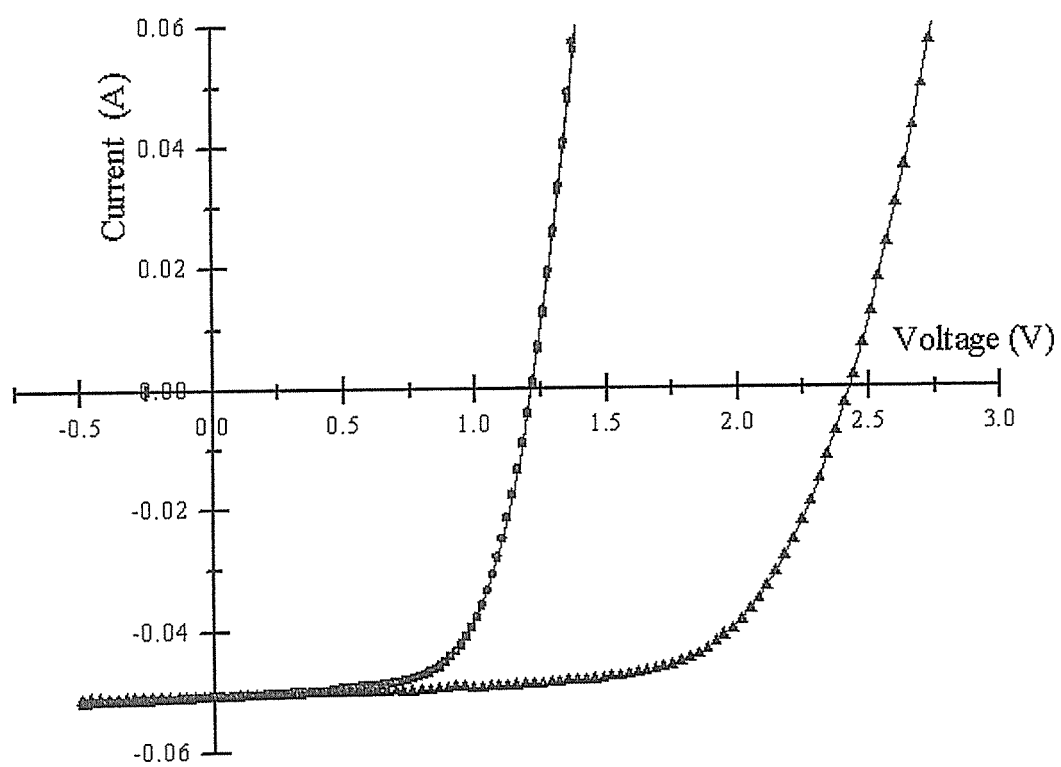
FIG. 21 is an IV curve diagram depicting the characteristics of photoelectric conversion of the silicon thin-film solar cell in Experiment VI.

Further, a 5 cm×5 cm second transparent glass substrate having a plurality of silicon thin-film solar cells connected in series formed thereon is disposed to cover the first transparent glass substrate. An open circuit voltage Voc of the silicon thin-film solar cell module is 2.4V, a current Jsc is 25 mA as shown in FIG. 21. The above-described photovoltaic electrochromic device is placed in the Peccell Pec-L11 sunlight simulator for illumination. In five minutes, the anodic photo-electrodeposition occurs below the anodes of the silicon thin-film solar cells, and the color of the anodes gradually changes from transparent to yellow green.

Thereafter, 0.1M of TBABF4 is dissolved in 100 ml of propylene carbonate solvent. Next, a 5 cm×5 cm third transparent glass substrate is provided, and the aforementioned electrolyte layer is applied on the third glass substrate. Further, a 5 cm×5 cm second transparent glass substrate, which includes silicon thin-film solar module photoelectroplated with poly aniline, is disposed to cover the third transparent glass substrate, so as to constitute a photovoltaic electrochromic device.

The above-described photovoltaic electrochromic device is placed in the Peccell Pec-L11 solar simulator for illumination. In three minute, oxidation occurs below the anodes of the silicon thin-film solar cells, and the color of the anodes gradually changes from yellow green to green.

The above experiments prove that the present invention achieves effects of color change under illumination.

Figure 22:
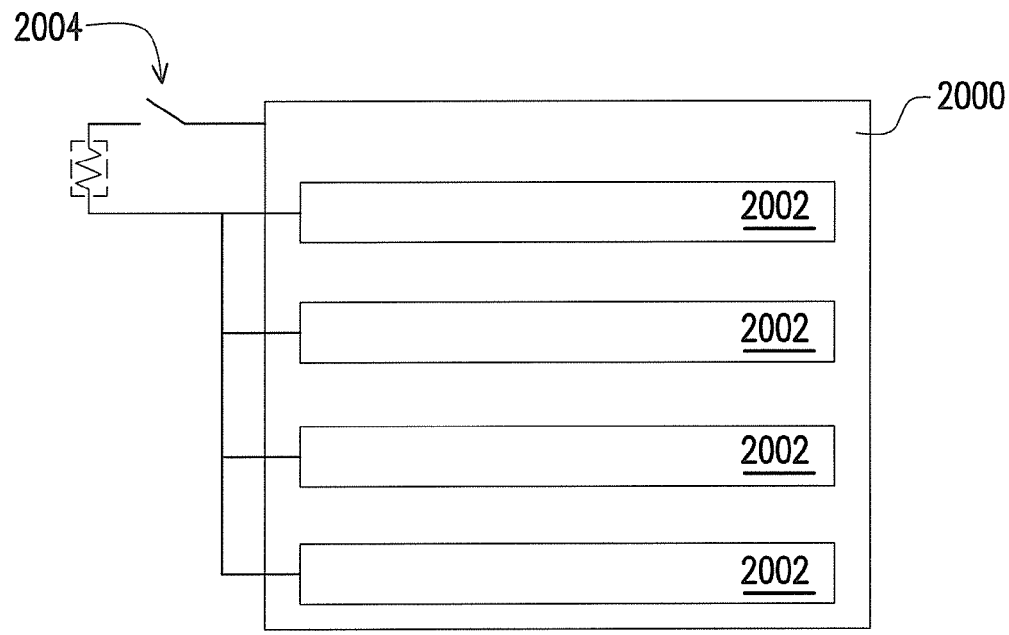
FIG. 22 is a schematic top view of a variation of the photovoltaic electrochromic device according to the present invention.
Figure 23:
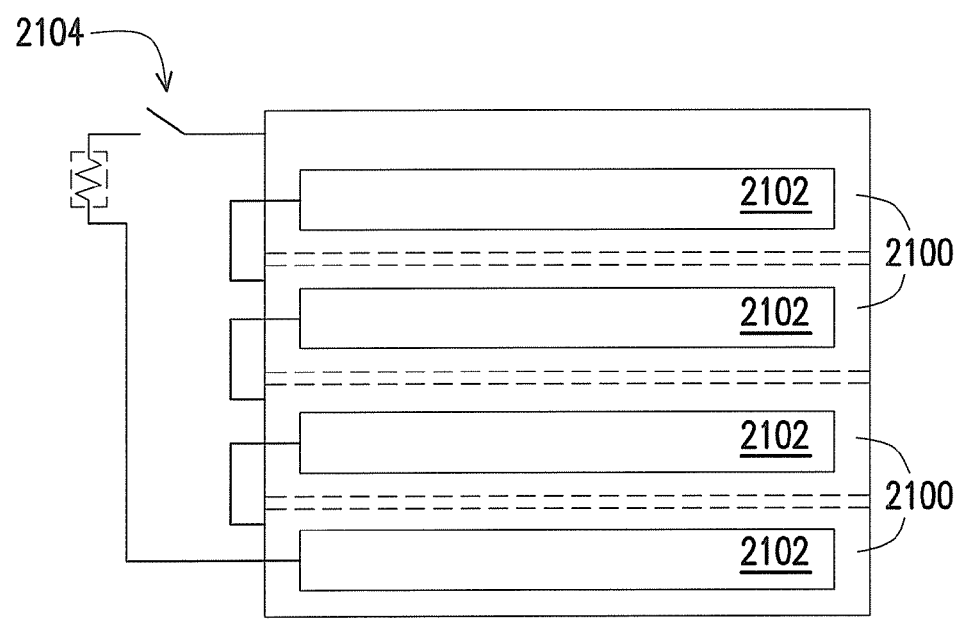
FIG. 23 is a schematic top view of a variation of the photovoltaic electrochromic device in FIG. 22.

FIGS. 22 and 23 respectively illustrate a parallel connection and a serial connection of thin-film solar cells, wherein the thin-film solar cells have an anode 2000 formed a continuous film as shown in FIG. 22 or have stripe anodes 2100 as shown in FIG. 23. In FIG. 22, cathodes 2002 are respectively connected to an output switch layout 2004. In FIG. 23, the anodes 2100 are connected with the cathodes 2102 of another thin-film solar cell and connected to an output switch layout 2104 through serial connection.

The following methods can be adopted to fabricate a switch for controlling the photovoltaic electrochromic device of the present invention.

Figure 24:
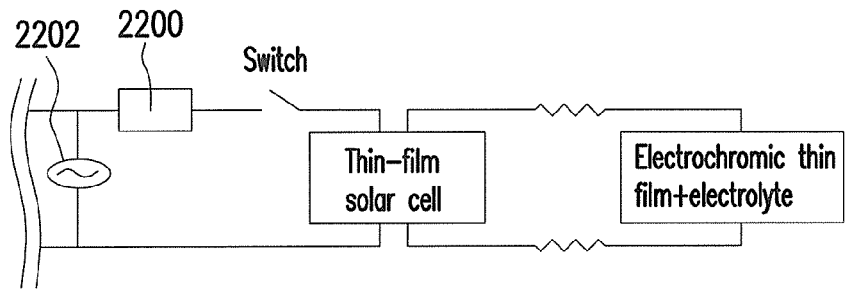
FIG. 24 is a diagram depicting a circuit between the photovoltaic electrochromic device of the present invention and an output switch layout.

Disposing a DC/AC inverter 2200 to convert the current generated by thin-film solar cells into alternating current (AC), i.e. electric utility 2202, for electric appliances, as shown in FIG. 24.

Figure 25:
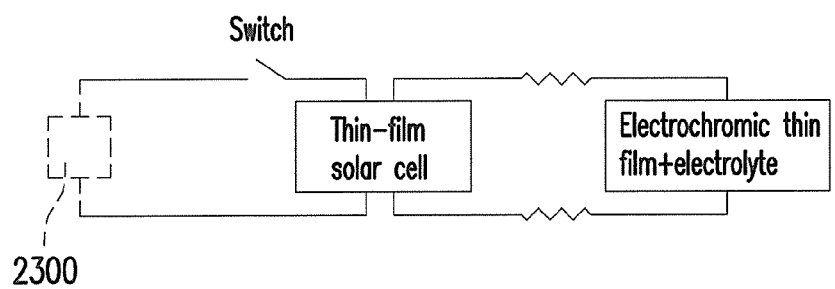
FIG. 25 is a diagram depicting a circuit between the photovoltaic electrochromic device of the present invention and another type of output switch layout.

Directing the current generated by the thin-film solar cells to a DC charge storage device 2300 (also serves as a battery for DC electric appliances), as shown in FIG. 25.

Figure 26:
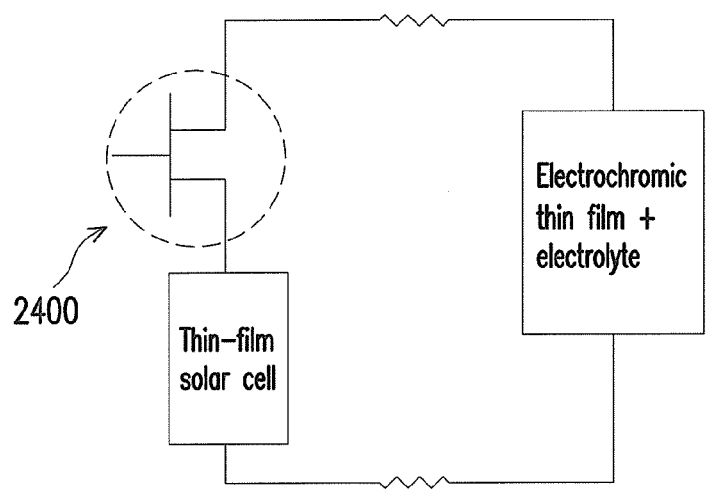
FIG. 26 is a diagram showing a circuit of the photovoltaic electrochromic device of the present invention and a thin-film transistor.

Utilizing a TFT fabricating process to dispose a thin-film transistor 2400 at the anode and the cathode of the thin-film solar cell to function as a switch for controlling on/off between each thin-film solar cell and an exterior circuit, so as to constitute an active control electrochromic device, as shown in FIG. 26.

In conclusion of the above, the present invention utilizes internal photo-induced voltage difference of the thin-film solar cells for electroplating, without employing an external electric bias field. When being illuminated, the anodes and the cathodes of the thin-film solar cells simultaneously generate electrons and holes, which cause the electroplating solution to react and deposit on the anodes and the cathodes. Thus, when the thin-film solar cells are formed on one transparent substrate, the anodes and the cathodes of electrochromic thin films are simultaneously formed on the surfaces of the anodes and the cathodes of the solar cells. Therefore, the photovoltaic electrochromic device of the present invention can both function as a solar cell having electrical power generation capability and as a smart window for building applications, such as utility benefit with grid-tied building integrated photovoltaic (BIPV). The current generated by the thin film solar cell when being illuminated, can be supplied to various electric appliances. When sunlight from the outside becomes so strong which increase indoor temperature, alternatively, the current is supplied to change the color of electrochromic materials. When used in glass, the photovoltaic electrochromic device can block ultraviolet, visible light and infrared spectrum. Consequently, indoor temperature and light can be reduced to improve comfort to the building owner and to achieve energy-saving purposes. Such a self-sufficient device only requires sunlight as energy source and brings two advantages. The photovoltaic electrochromic device has various applications other than BIPV and smart window. With a different design of thin-film solar cells, the photovoltaic electrochromic device can be applied to fabricate color-changing rear view minors, windows for transportation vehicles, car roofs, displays, optical filters, optical sensors and so forth. Therefore, the present invention is inventive and applicable, and provides a possible solution to the energy crisis.

Although the present invention has been described with reference to the above embodiments, it is apparent to one of the ordinary skill in the art that modifications to the described embodiments may be made without departing from the spirit of the invention. Accordingly, the scope of the invention will be defined by the attached claims not by the above detailed descriptions.

What is claimed is:

1. A photovoltaic electrochromic device, at least comprising:
   a transparent substrate;
   a plurality of thin-film solar cells formed on the transparent substrate, wherein each of the thin-film solar cells at least comprises an anode, a photoelectric conversion layer, and a cathode, and a portion of a surface of the anode is exposed from the thin film solar cells;
   a plurality of electrochromic thin films, each disposed on a surface of the cathode or on the exposed surface of the anode of each of the thin-film solar cells; and
   an electrolyte layer covering the electrochromic thin films.

2. The photovoltaic electrochromic device as claimed in claim 1, wherein a material of each of the electrochromic thin films comprises conducting polymer, transition metal oxide, transition metal or Prussian blue.

3. The photovoltaic electrochromic device as claimed in claim 2, wherein the transition metal oxide is selected from a group consisting of $WO_3$, $MoO_3$, $V_2O_5$, $Nb_2O_5$, NiO, SnO, $Fe_2O_3$, CoO, $Ir_2O_3$, $Rh_2O_3$, and $MnO_2$.

4. The photovoltaic electrochromic device as claimed in claim 2, wherein the transition metal is selected from metal, alloy, hydride, chalcogenide or telluride formed from a group of transition metal consisting of Mn, Mg, Co, Cu, Ni, Zn, V, Cr, Fe, Bi, Sb, Au, Zn, Pt, Ag, Ti, Nb, Te and Se.

5. The photovoltaic electrochromic device as claimed in claim 1, wherein the thin-film solar cells comprise silicon thin-film solar cell, CIGS thin-film solar cell, or CdTe thin-film solar cell.

6. The photovoltaic electrochromic device as claimed in claim 5, wherein the silicon thin-film solar cell comprises a-Si thin-film solar cell, a-Si/mc-Si tandem thin-film solar cell, a-Si/a-Si tandem thin-film solar cell or multijunction a-Si thin film solar cell.

7. The photovoltaic electrochromic device as claimed in claim 5, wherein the thin-film solar cells are connected in series; and the anode of one of the thin-film solar cells is electrically connected to the cathode of another one of thin-film solar cells.

8. The photovoltaic electrochromic device as claimed in claim 7, wherein the anode is exposed between the cathodes, and a shading area of each of the electrochromic thin films is determined by a width of an interval between the cathodes.

9. The photovoltaic electrochromic device as claimed in claim 5, further comprises a passivation layer disposed on a sidewall of the photoelectric conversion layer of each of the thin-film solar cells.

10. The photovoltaic electrochromic device as claimed in claim 1, wherein the electrolyte layer comprises solid electrolyte or liquid electrolyte.

11. The photovoltaic electrochromic device as claimed in claim 1, wherein the transparent substrate comprises a glass, plastic or flexible substrate.

12. The photovoltaic electrochromic device as claimed in claim 1, further comprising a transparent non-conductive substrate covering the electrolyte layer.

13. The photovoltaic electrochromic device as claimed in claim 12, further comprising a reflective film disposed on a surface of the transparent non-conductive substrate to form a mirror.

14. The photovoltaic electrochromic device as claimed in claim 1, further comprising a DC/AC inverter to convert current generated by the thin-film solar cells into utility grid.

15. The photovoltaic electrochromic device as claimed in claim 1, further comprising a DC charge storage device to store the current generated by the thin-film solar cells.

16. The photovoltaic electrochromic device as claimed in claim 1, further comprising a thin-film transistor connected to the anodes and the cathodes of the thin-film solar cells to control a switch between the thin-film solar cells and an exterior circuit.

17. A method of manufacturing a photovoltaic electrochromic device, the method comprising:
forming a plurality of thin-film solar cells on a transparent substrate, wherein each of the thin-film solar cells at least comprises an anode, a photoelectric conversion layer, and a cathode, and a portion of a surface of the anode is exposed from each of the thin film solar cells;
depositing a plurality of electrochromic thin films on a surface of the cathode or on the exposed surface of the anode of each of the thin-film solar cells; and
forming an electrolyte layer on the thin-film solar cells to cover the electrochromic thin films, wherein the anode and the cathode of each of the thin-film solar cells also serve as an anode and a cathode of the photovoltaic electrochromic device.

18. The manufacturing method as claimed in claim 17, wherein a method of depositing the electrochromic thin films comprises:
disposing an electroplating solution to be in contact with the anode and the cathode of each of the thin-film solar cells;
illuminating the thin-film solar cells to generate current, which causes redox reaction in the electroplating solution to form the electrochromic thin films on the exposed surface of the anode or on the surface of the cathode of each of the thin-film solar cells; and
removing the electroplating solution.

19. The manufacturing method as claimed in claim 18, wherein a composition of each of the electrochromic thin films comprises a high molecular polymer formed by electropolymerization of aniline monomer, EDOT monomer or viologen monomer; or electroplating of ferric-ferrocyanide chromophore or nickel oxyhydroxide or $WO_3$ thin film.

20. The manufacturing method as claimed in claim 18, wherein the electroplating solution comprises aniline monomer, EDOT monomer, or viologen monomer; ferric-ferrocyanide chromophore; or nickel oxyhydroxide or peroxytungstate electroplating solution.

21. The manufacturing method as claimed in claim 17, wherein the method of depositing the electrochromic thin films comprises electron beam evaporation, ion-assisted coating, reactive and non-reactive sputtering, thermal evaporation, CVD, plasma enhanced CVD or atmospheric pressure CVD.

22. The manufacturing method as claimed in claim 21, wherein a material of each of the electrochromic thin films comprises transition metal oxide or transition metal.

23. The manufacturing method as claimed in claim 22, wherein the transition metal oxide is selected from a group consisting of $WO_3$, $MoO_3$, $V_2O_5$, $Nb_2O_5$, NiO, SnO, $Fe_2O_3$, CoO, $Ir_2O_3$, $Rh_2O_3$, and $MnO_2$.

24. The manufacturing method as claimed in claim 22, wherein the transition metal is selected from metal, alloy, hydride, chalcogenide or telluride formed from a group of transition metal consisting of Mn, Mg, Co, Cu, Ni, Zn, V, Cr, Fe, Bi, Sb, Au, Zn, Pt, Ag, Ti, Nb, Te and Se.

25. The manufacturing method as claimed in claim 17, wherein the thin-film solar cells comprise silicon thin-film solar cell CIGS thin-film solar cell, or CdTe thin-film solar cell.

26. The manufacturing method as claimed in claim 25, wherein a process of forming the thin-film solar cells on the transparent substrate further comprises forming a passivation layer on a sidewall of the photoelectric conversion layer of each of the thin-film solar cells.

27. The manufacturing method as claimed in claim 17, wherein the electrolyte layer comprises solid electrolyte or liquid electrolyte.

28. The manufacturing method as claimed in claim 27, wherein the step of forming the electrolyte layer comprises electrolytic depositing the solid electrolyte on the thin-film solar cells.

29. The manufacturing method as claimed in claim 27, wherein the step of forming the electrolyte layer comprises successively vacuum depositing the solid electrolyte on the thin-film solar cells.

30. The manufacturing method as claimed in claim 27, wherein the liquid electrolyte comprises an alkali metal salt and a solvent.

31. The manufacturing method as claimed in claim 30, wherein the alkali metal salt comprises lithium trifluoromethylsulfonate, lithium perchlorate, bis(trifluoroethylsulfonyl)imide or tetra alkyl ammonium salt.

32. The manufacturing method as claimed in claim 30, wherein the solvent comprises propylene carbonate, dipropyl carbonate, glycol carbonate, γ-butyrolactone, acetonitrile, tetrahydrofuran, or N-methyl-2-pyrrolidone.

33. The manufacturing method as claimed in claim 27, wherein the solid electrolyte comprises an alkali metal salt, a solvent and a polymer.

34. The manufacturing method as claimed in claim 33, wherein the polymer comprises Poly(ethylene oxide), Poly(propylene oxide), Poly(vinyl butyral), or Poly(methyl methacrylate) or the mixture thereof.

35. The manufacturing method as claimed in claim 17, further comprising disposing a transparent non-conductive substrate to cover the electrolyte layer after forming the electrolyte layer.

36. The manufacturing method as claimed in claim 35, further comprising bonding the transparent substrate, the electrolyte layer, and the transparent non-conductive layer with a laminator or an autoclave after forming the electrolyte layer.

37. The manufacturing method as claimed in one of claim 35, wherein the process of forming the electrolyte layer further comprising bonding the transparent substrate, the electrolyte layer, and the transparent non-conductive substrate with a laminator or an autoclave.

38. The manufacturing method as claimed in claim 35, further comprising forming a reflective film on a surface of the transparent non-conductive substrate to form a minor before disposing the transparent non-conductive substrate to cover the electrolyte layer.

* * * * *